(12) United States Patent
Lee et al.

(10) Patent No.: US 9,460,855 B2
(45) Date of Patent: Oct. 4, 2016

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Byoung Hwa Lee, Suwon-Si (KR); Kyo Kwang Lee, Suwon-Si (KR); Min Cheol Park, Suwon-Si (KR); Young Ghyu Ahn, Suwon-Si (KR); Sang Soo Park, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 14/504,000

(22) Filed: Oct. 1, 2014

(65) Prior Publication Data
US 2015/0090485 A1    Apr. 2, 2015

(30) Foreign Application Priority Data

Oct. 1, 2013   (KR) .................. 10-2013-0117571
Sep. 22, 2014  (KR) .................. 10-2014-0126164

(51) Int. Cl.
*H01G 4/30*   (2006.01)
*H01G 2/06*   (2006.01)
(Continued)

(52) U.S. Cl.
CPC .............. *H01G 4/30* (2013.01); *H01G 2/065* (2013.01); *H01G 4/008* (2013.01); *H01G 4/12* (2013.01); *H01G 4/232* (2013.01); *H01G 4/248* (2013.01); *H05K 1/111* (2013.01); *H05K 1/181* (2013.01); *H05K 3/3436* (2013.01); *H05K 2201/10015* (2013.01); *H05K 2201/10636* (2013.01); *Y02P 70/611* (2015.11)

(58) Field of Classification Search
CPC ........ H01G 4/30; H01G 4/005; H01G 4/228; H01G 4/232; H01G 4/252
See application file for complete search history.

(56) References Cited

U.S. PATENT DOCUMENTS 4,419,714 A  † 12/1983 Locke
8,238,116 B2 †  8/2012 Eggerding
(Continued)

FOREIGN PATENT DOCUMENTS

| KR | 10-2008-0110180 A | 12/2008 |
|---|---|---|
| KR | 10-0920614 B1 | 10/2009 |
| KR | 10-2009-0117686 A | 11/2009 |

OTHER PUBLICATIONS

M. Osterman; "Mitigation Strategies for Tin-Whiskers"; pp. 1-11; published/released Jul. 3, 2002 (updated Aug. 28, 2002); University of Maryland; http://nepp.nasa.gov/whisker/reference/reference.html (Item 81), http://www.calce.umd.edu/lead-free/tin-whiskers/TINWHISKERMITIGATION.pdf.†

(Continued)

*Primary Examiner* — Dion R Ferguson
(74) *Attorney, Agent, or Firm* — McDermott Will & Emery LLP

(57) ABSTRACT

A multilayer ceramic capacitor may include: three external electrodes disposed on amounting surface of a ceramic body to be spaced apart from one another. When a thickness of an active layer including a plurality of first and second internal electrodes disposed therein is defined as AT, and a gap between a first or second lead part of the first internal electrode and a third lead part of the second internal electrode is defined as LG, the following Equation may be satisfied: $0.00044 \leq LG*\log[1/AT] \leq 0.00150$.

22 Claims, 11 Drawing Sheets

(51) Int. Cl.
*H01G 4/232* (2006.01)
*H01G 4/008* (2006.01)
*H01G 4/12* (2006.01)
*H01G 4/248* (2006.01)
*H05K 1/11* (2006.01)
*H05K 1/18* (2006.01)
*H05K 3/34* (2006.01)

(56) References Cited

U.S. PATENT DOCUMENTS

| | | | | |
|---|---|---|---|---|
| 9,343,236 B2* | 5/2016 | Kim | ........................ | H01G 4/30 361/301.4 |
| 2005/0105246 A1* | 5/2005 | Kuroda | .................. | H01G 4/232 361/328 |
| 2008/0174934 A1* | 7/2008 | Togashi | .................. | H01G 4/012 361/303 |
| 2008/0186652 A1* | 8/2008 | Lee | ........................ | H01G 4/012 361/306.3 |
| 2008/0310078 A1 | 12/2008 | Lee et al. | | |
| 2010/0157506 A1* | 6/2010 | Togashi | .................. | H01G 4/012 361/303 |
| 2012/0268860 A1* | 10/2012 | Chung | .................... | H01G 4/30 361/301.4 |

OTHER PUBLICATIONS

J. Brusse, G. Ewell, and J. Siplon; "Tin Whiskers: Attributes and Mitigation"; pp. 221-233; published Oct. 15, 2002; NASA Goddard Publications; http://nepp.nasa.gov/whisker/reference/reference.html (Item 20), http://nepp.nasa.gov/whisker/reference/tech_papers/brusse2002-paper-tin-whiskers-attributes-and-mitigation-CARTS-europe.pdf.†

\* cited by examiner
† cited by third party

MULTILAYER CERAMIC CAPACITOR AND BOARD HAVING THE SAME

CROSS-REFERENCE TO RELATED APPLICATION

This application claims the benefit of Korean Patent Application Nos. 10-2013-0117571 filed on Oct. 1, 2013, and 10-2014-0126164 filed on Sep. 22, 2014, with the Korean Intellectual Property Office, the disclosures of which are incorporated herein by reference.

BACKGROUND

The present disclosure relates to a multilayer ceramic capacitor and a board having the same.

In accordance with the recent trend toward miniaturization and an increase in capacitance of electronic products, increasing demands have been made for electronic components used in electronic products to have a small size and high capacitance.

Among electronic components, in the case of a multilayer ceramic capacitor, when equivalent series inductance (hereinafter, referred to as "ESL") increases, performance of an electronic product to which the capacitor is applied may be deteriorated. In addition, in accordance with miniaturization and an increase in capacitance of the applied electronic component, an increase in ESL of the multilayer ceramic capacitor may relatively significantly affect deterioration in performance of the electronic product.

Particularly, in accordance with an increase in performance of an integrated circuit (IC), decoupling capacitors have been increasingly used. Therefore, demand for multilayer ceramic capacitors (MLCCs) having a three-terminal vertical multilayer structure, so-called "low inductance chip capacitors (LICC)", capable of decreasing inductance in the capacitor by decreasing a distance between external terminals to decrease a current flow path, has increased.

SUMMARY

An aspect of the present disclosure may provide a multilayer ceramic capacitor capable of significantly reducing ESL characteristics, and a board having the same.

According to an exemplary embodiment the present disclosure, a multilayer ceramic capacitor may include: three external electrodes disposed on a mounting surface of a ceramic body to be spaced apart from one another, wherein when a thickness of an active layer including a plurality of first and second internal electrodes disposed therein is defined as AT, and a gap between a first or second lead part of the first internal electrode and a third lead part of the second internal electrode is defined as LG, the following Equation is satisfied: $0.00044 \leq LG*\log[1/AT] \leq 0.00150$.

According to another aspect of the present disclosure, a board having the multi layer ceramic capacitor may be provided.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
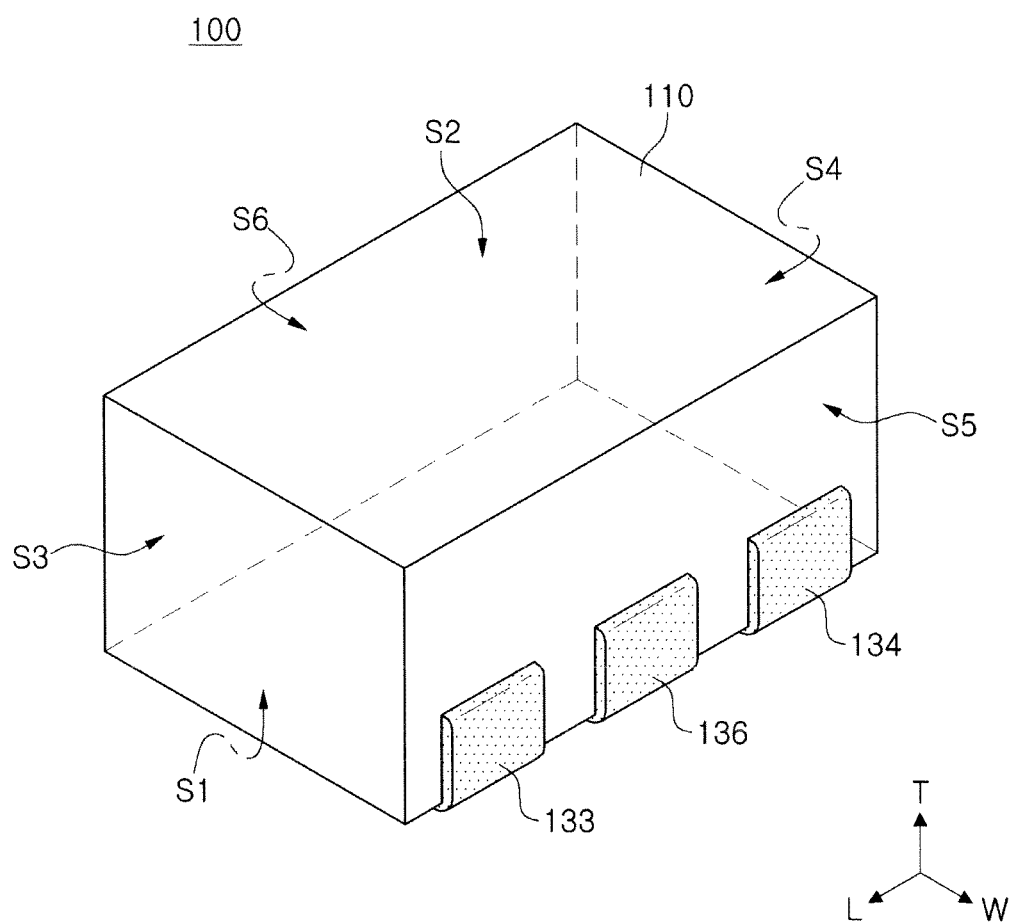
FIG. 1 is a perspective view schematically showing a multilayer ceramic capacitor according to an exemplary embodiment in the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Directions of a hexahedron will be defined in order to clearly describe exemplary embodiments in the present disclosure. L, W and T shown in FIG. 1 refer to a length direction, a width direction, and a thickness direction, respectively. Here, the width direction may be used to have the same concept as a direction in which dielectric layers are stacked.

Multilayer Ceramic Capacitor

Figure 2:
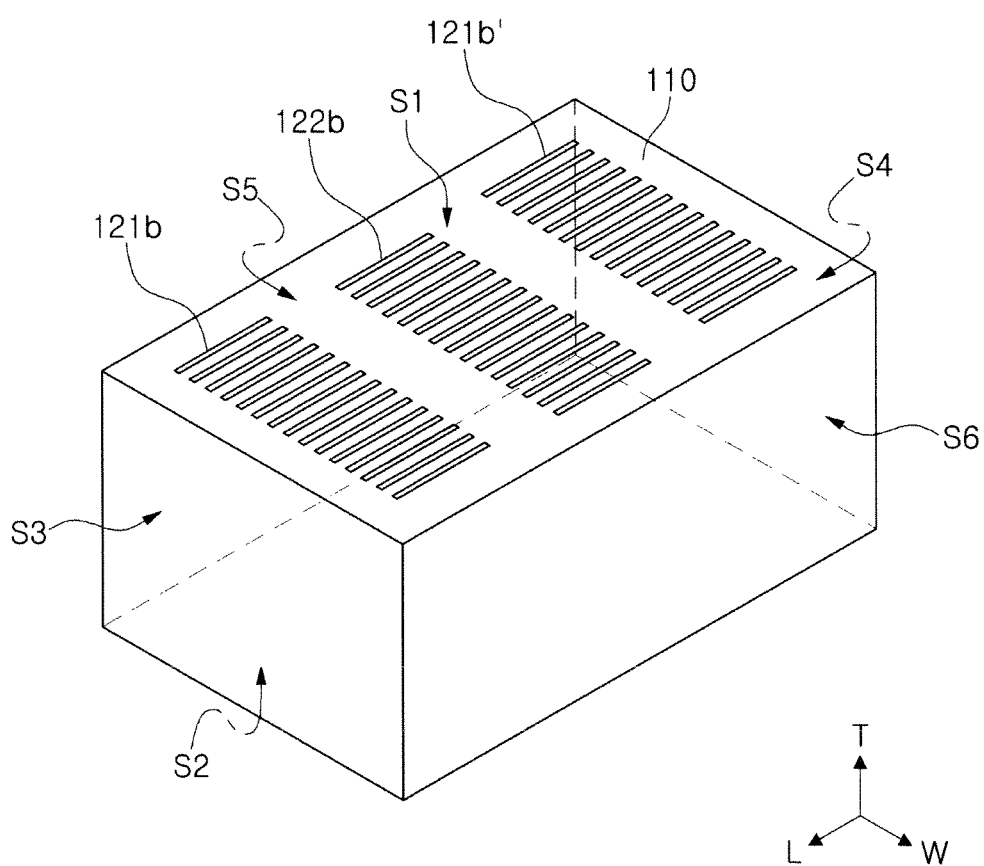
FIG. 2 is a perspective view showing a ceramic body of the multilayer ceramic capacitor of FIG. 1 in a state in which the ceramic body is turned over.
Figure 3:
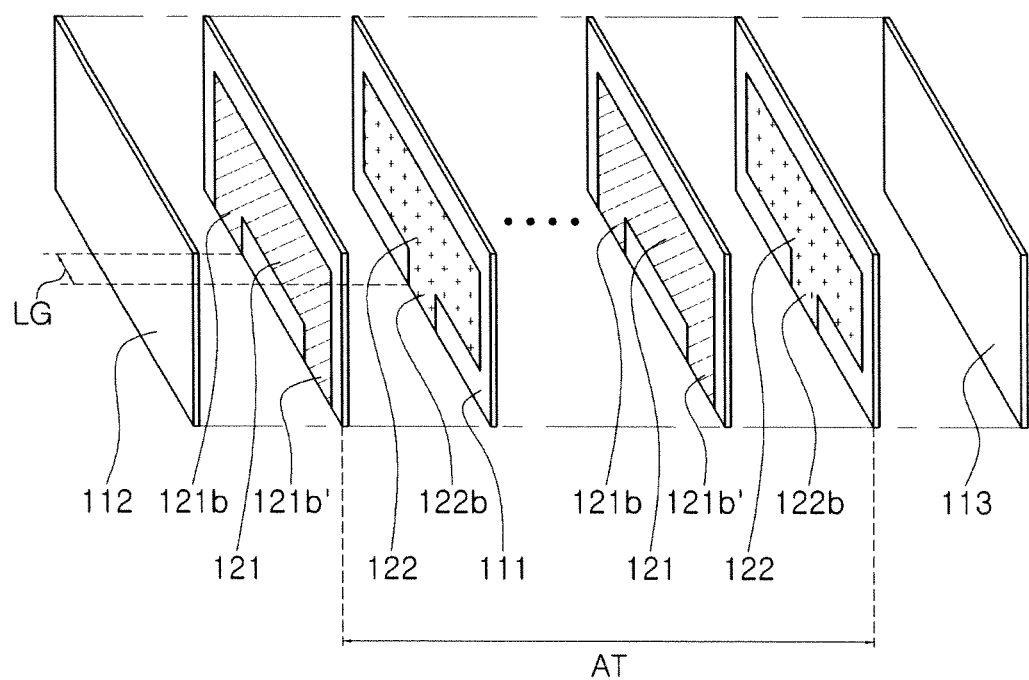
FIG. 3 is an exploded perspective view showing the multilayer ceramic capacitor of FIG. 1 in a state in which an external electrode thereof is omitted.
Figure 4:
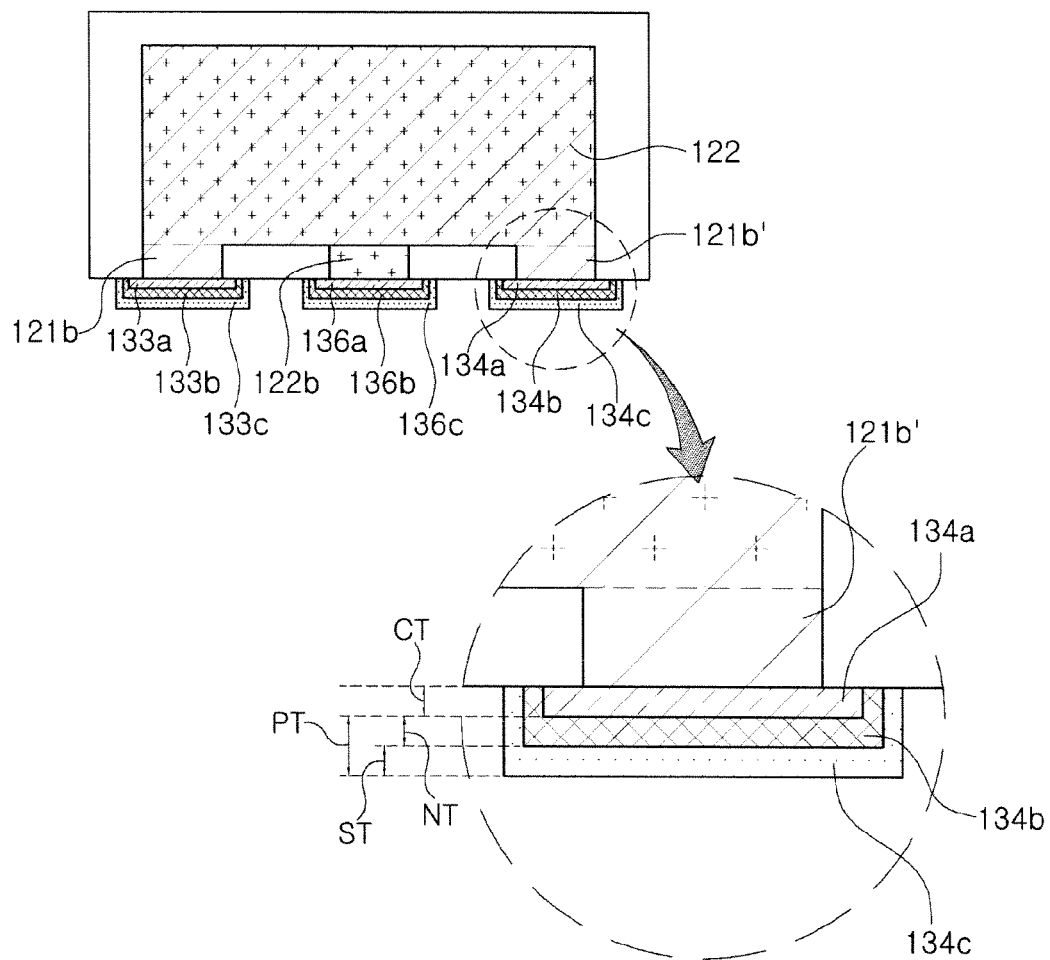
FIG. 4 is a cross-sectional view showing the multilayer ceramic capacitor of FIG. 1.

FIG. 1 is a perspective view schematically showing a multilayer ceramic capacitor according to an exemplary embodiment in the present disclosure, FIG. 2 is a perspective view showing a ceramic body of the multilayer ceramic capacitor of FIG. 1 in a state in which the ceramic body is turned over; FIG. 3 is an exploded perspective view showing the multilayer ceramic capacitor of FIG. 1 in a state in which an external electrode thereof is omitted; and FIG. 4 is a cross-sectional view showing the multilayer ceramic capacitor of FIG. 1.

Referring to FIGS. 1 through 4, a multilayer ceramic capacitor 100 according to the exemplary embodiment may include a ceramic body 110 in which a plurality of dielectric layers 111 are stacked in the width direction, an active layer including a plurality of first and second internal electrodes 121 and 122, and first to third external electrodes 133, 134, and 136.

That is, the multilayer ceramic capacitor 100 according to the exemplary embodiment may be considered as a three-terminal capacitor having a total of three external terminals.

The ceramic body 110 may have first and second main surfaces S1 and S2 opposing each other in the thickness direction, first and second end surfaces S3 and S4 connecting the first and second main surfaces S1 and S2 and opposing each other in the length direction, and first and second side surfaces S5 and S6 opposing each other in the width direction.

Hereinafter, in the exemplary embodiment, a mounting surface of the multilayer ceramic capacitor 100 may be the first main surface S1 of the ceramic body 110.

The ceramic body 110 as described above may be formed by stacking the plurality of dielectric layers 111 in the width direction and then sintering the stacked dielectric layers 111, and a shape thereof is not particularly limited, but may be a hexahedral shape as shown in the accompanying drawings. However, a shape and a dimension of the ceramic body 110 and the number of stacked dielectric layers 111 are not limited to those of the exemplary embodiment shown in the accompanying drawings.

In addition, the plurality of dielectric layers 111 configuring the ceramic body 110 may be in a sintered state, and boundaries between the dielectric layers 111 adjacent to each other may be integrated such that they may not be readily discernible without a scanning electron microscope (SEM).

The ceramic body 110 as described above may include the active layer having the internal electrodes therein, as apart contributing to capacitance formation of the capacitor, and cover layers 112 and 113 formed on both side surfaces of the active layer in the width direction, respectively, as margin parts in the width direction.

The active layer may be formed by repeatedly stacking the plurality of first and second internal electrodes 121 and 122 with each of the dielectric layers 111 interposed therebetween.

In this case, a thickness of the dielectric layers 111 maybe optionally changed according to a capacitance design of the multilayer ceramic capacitor 100, but a thickness of a single dielectric layer may be preferably 0.01 to 1.00 μm after a sintering process. However, the present disclosure is not limited thereto.

Further, the dielectric layers 111 may contain a ceramic powder having high permittivity, for example, a barium titanate ($BaTiO_3$) based powder or a strontium titanate ($SrTiO_3$) based powder, or the like, but the present disclosure is not limited thereto as long as sufficient capacitance may be obtained.

In addition, if necessary, in addition to the ceramic powder, a ceramic additive, an organic solvent, a plasticizer, a binder, a dispersant, and the like, may be further added to the dielectric layers 111.

Further, an average particle size of the ceramic powder used to form the dielectric layers 111 is not particularly limited and may be controlled in order to achieve objects of the present disclosure. For example, the average particle size of the ceramic powder may be controlled to be 400 nm or less.

The cover layers 112 and 113 may have the same material and configuration as those of the dielectric layers 111 except that internal electrodes are not included therein.

In addition, the cover layers 112 and 113 may be formed by stacking a single dielectric layer or at least two dielectric layers on both side surfaces of the active layer in the width direction, respectively, and generally serve to prevent the first and second internal electrodes 121 and 122 from being damaged by physical or chemical stress.

The first and second internal electrodes 121 and 122, electrodes having different polarities, may be formed in the ceramic body 110 and disposed to face each other, with each of the dielectric layers 111 interposed therebetween. In this case, the first and second internal electrodes 121 and 122 may be electrically insulated from each other by the dielectric layers 111 disposed therebetween.

In addition, the first and second internal electrodes 121 and 122 may be disposed to be spaced apart from the first and second end surfaces S3 and S4 of the ceramic body 110 in the length direction.

The first and second internal electrodes 121 and 122 may include a capacitance part formed by overlapping the internal electrodes adjacent thereto to contribute to capacitance formation, and lead parts formed by extending portions of the capacitance part to be exposed outwardly from the ceramic body 110.

In this case, the lead parts are not particularly limited, but for example, may have a length smaller than a length of the internal electrodes configuring the capacitance part in the length direction of the ceramic body 110.

Further, a thickness of the first and second internal electrodes 121 and 122 may be determined according to an intended use thereof. For example, the thickness of each of the first and second internal electrodes 121 and 122 may be determined to be in a range of 0.2 to 1.0 μm in consideration of a size of the ceramic body 110, but the present disclosure is not limited thereto.

In addition, a material for forming the first and second internal electrodes 121 and 122 is not particularly limited. For example, the first and second internal electrodes 121 and 122 may be formed using a conductive paste formed of at least one of a noble metal material such as palladium (Pd), a palladium-silver (Pd—Ag) alloy, or the like, nickel (Ni), and copper (Cu).

Further, as a printing method of the conductive paste, a screen printing method, a gravure printing method, or the like, may be used, but the present disclosure is not limited thereto.

In the exemplary embodiment, first and second lead parts 121b and 121b' may be disposed to be spaced apart from each other in the length direction of the ceramic body 110, and may be formed in the first internal electrode 121 to be extended and exposed to the first main surface S1, the mounting surface of the ceramic body 110.

A third lead part 122b may be disposed between the first and second lead parts 121b and 121b', and may be formed in the second internal electrode 122 to be extended and exposed to the first main surface S1 of the ceramic body 110.

The first and second external electrodes 133 and 134, electrodes having the same polarity as each other, may be disposed on the first main surface S1 of the ceramic body 110 to be spaced apart from each other in the length direction of the ceramic body 110, and may come into contact with the first and second lead parts 121b and 121b' exposed to the first main surface S1 of the ceramic body 110, respectively, to thereby be electrically connected thereto.

The first and second external electrodes 133 and 134 as described above may be extended from the first main surface S1 of the ceramic body 110 to portions of the first and second side surfaces S5 and S6 of the ceramic body 110 in the width direction.

The third external electrode 136, an electrode having a different polarity from that of the first and second external electrodes 133 and 134, may be used as a ground terminal in the exemplary embodiment.

The third external electrode 136 may be disposed between the first and second external electrodes 133 and 134 and come into contact with the third lead part 122b exposed to the first main surface S1 of the ceramic body 110 to thereby be electrically connected thereto.

The third external electrode 136 as described above may be extended from the first main surface S1 of the ceramic body 110 to portions of the first and second side surfaces S5 and S6 of the ceramic body 110 in the width direction.

In this case, a thickness of the first to third external electrodes may be 10 to 40 μm. At this time, ESL of the multilayer ceramic capacitor 100 may have a value of 50 pH or less.

Further, in this case, since gaps between the first and second external electrodes 133 and 134 and the third external electrode 136 are small, a current loop may be decreased, thereby decreasing inductance.

The first to third external electrodes 133, 134, and 136 as described above may have a three layer structure and may include first to third conductive layers 133a, 134a, and 136a coming into contact with the lead parts of the internal electrodes disposed in positions corresponding to the conductive layers, respectively, to thereby be connected thereto, first to third nickel (Ni) plating layers 133b, 134b, and 136b formed to cover the first to third conductive layers 133a, 134a, and 136a, and first to third tin (Sn) plating layers 133c, 134c, and 136c formed to cover the first to third nickel plating layers 133b, 134b, and 136b.

The first to third conductive layers 133a, 134a, and 136a may be formed of the same conductive material as that of the first and second internal electrodes 121 and 122, but the present disclosure is not limited thereto. For example, the first to third conductive layers 133a, 134a, and 136a may be formed using powder particles of a metal such as copper (Cu), silver (Ag), nickel (Ni), and the like, and may be formed by applying a conductive paste prepared by adding a glass frit to the metal powder particles and then sintering the applied conductive paste.

Hereinafter, relationships between dimensions of components included in the multilayer ceramic capacitor according to the exemplary embodiment, the securing of reliability, and ESL will be described.

Referring to FIG. 3, when a thickness of the active layer of the ceramic body 110 is defined as AT, and a gap between the first or second lead part 121b or 121b' and the third lead part 122b is defined as LG, a relationship between a thickness of a capacitance formation region of the chip and a distance between the lead parts of the internal electrodes may satisfy the following Equation: $0.00044 \leq LG*\log[1/AT] \leq 0.00150$. In this case, ESL of the multilayer ceramic capacitor 100 may be 50 pH or less.

Here, the thickness AT of the active layer of the ceramic body 110 is associated with a current width, and as the thickness AT is increased, magnetic fluxes may be offset with each other, such that ESL may be decreased. Since in an ideal case, the current width is similar to a diameter of a cross-section of a conducting wire, the current wire may be in proportion to $\log[1/AT]$.

In addition, the gap LG between the first or second lead part 121b or 121b' and the third lead part 122b is associated with a current length, and as the gap LG is decreased, an area of the current loop is decreased, such that ESL may be decreased.

Further, it may be preferable that the gap LG between the first or second lead part 121b or 121b' and the third lead part 122b is greater than 100 μm.

In a case in which the gap LG between the first or second lead part 121b or 121b' and the third lead part 122b is 100 μm or less, the gap between the lead parts may be excessively narrow, such that a mounting defect may be generated.

Referring to FIG. 4, a thickness of the first to third conductive layers 133a, 134a, and 136a may be defined as CT, a thickness of the first to third nickel plating layers 133b, 134b, and 136b may be defined as NT, a thickness of the first to third tin plating layers 133c, 134c, and 136c may be defined as ST, and a sum of the thicknesses of the nickel plating layers and the tin plating layers may be defined as PT.

Here, the thickness CT of the first to third conductive layers 133a, 134a, and 136a may be 5 to 25 μm.

Further, the thickness NT of the first to third nickel plating layers 133b, 134b, and 136b may be 2 μm or more.

In addition, the thickness ST of the first to third tin plating layers 133c, 134c, and 136c may be 3 μm or more.

Further, the sum PT of the thicknesses of the nickel plating layers and the tin plating layers may be 15 μm or less.

Deterioration in reliability due to the infiltration of a plating solution may also be prevented by setting thicknesses of the first to third external electrodes as described above. A detailed description thereof will be provided in the following Experimental Example.

Experimental Example

Multilayer ceramic capacitors according to Inventive Examples and Comparative Examples were manufactured as follows.

Slurry containing powder such as barium titanate (BaTiO$_3$), or the like, was applied onto carrier films and then dried to prepare a plurality of ceramic green sheets each having a thickness of 1.8 μm.

Next, first internal electrodes having first and second lead parts exposed to a first main surface of the ceramic green sheets and second internal electrodes having a third lead part spaced apart from the first and second lead parts and exposed to the first main surface of the ceramic green sheets may be formed by applying a conductive paste for a nickel internal electrode onto the ceramic green sheets using a screen.

Then, about 200 ceramic green sheets were stacked, but ceramic green sheets on which the first and second internal electrodes were not formed were further stacked on both side surfaces of the stacked ceramic green sheets, thereby manufacturing a multilayer body. Thereafter, the isostatic pressing was performed on the multilayer body at 85° C. and a pressure of 1000 kgf/cm$^2$.

Next, the pressed ceramic multilayer body was cut into individual chips, and the cut chip was maintained at a temperature of 230° C. for 60 hours under the air atmosphere to thereby be subjected to a debinding process.

Next, the chip was sintered at a temperature of about 1,200° C. under a reducing atmosphere having oxygen partial pressure of $10^{-11}$ to $10^{-10}$ atm lower than a Ni/NiO balanced oxygen partial pressure in such a manner that the internal electrodes were not oxidized, thereby preparing a ceramic body.

A chip size of the multilayer chip capacitor after being sintered was about 1.0 mm×0.5 mm (Length×Width (L×W), 1005 size). Here, a manufacturing tolerance was determined in a range of ±0.1 mm (length×width (L×w)), Thereafter, the multilayer chip capacitor was subjected to a process of forming first to third external electrodes on a first main surface of the ceramic body so as to correspond to the first to third lead parts of the first and second internal electrodes, respectively, to thereby complete a multilayer ceramic capacitor. Then, whether or not high temperature load defect occurred, whether or not reliable adhesion was performed, and whether or not a soldering defect occurred were tested, and equivalent serial inductance (ESL) was measured and tested. The results were shown in Tables 1 to 6.

Each of the tests was performed on 100 test samples. In this case, a gap LG between the first or second lead part and the third lead part was set to 400 μm.

Here, a case in which a defect rate was less than 0.01% was determined to be excellent (⊚), a case in which the defect rate was 0.01% or more to less than 1% was determined to be good (○), a case in which the defect rate was 1% or more to less than 50% was determined to be defective (Δ), and a case in which the defect rate was 50% or more was determined to be significantly defective (x). In addition, a case in which ESL was 50 pH or less was determined to be good.

TABLE 1

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 3 | 1 | 2 | 3 | 6 | X | X | X | 24 |
|   |   | 3 | 4 | 7 | X | X | ○ | 25 |
|   |   | 5 | 6 | 9 | X | X | ⊚ | 27 |
|   |   | 9 | 10 | 13 | X | X | ⊚ | 28 |
| 3 | 2 | 2 | 4 | 7 | X | ○ | X | 25 |
|   |   | 3 | 5 | 8 | X | ○ | ○ | 25 |
|   |   | 5 | 7 | 10 | X | ○ | ⊚ | 26 |
|   |   | 9 | 11 | 14 | X | ○ | ⊚ | 28 |
| 3 | 3 | 2 | 5 | 8 | X | ⊚ | X | 26 |
|   |   | 3 | 6 | 9 | X | ⊚ | ○ | 27 |
|   |   | 5 | 8 | 11 | X | ⊚ | ⊚ | 27 |
|   |   | 9 | 12 | 15 | X | ⊚ | ⊚ | 29 |
| 3 | 5 | 2 | 7 | 10 | X | ⊚ | X | 27 |
|   |   | 3 | 8 | 11 | X | ⊚ | ○ | 27 |
|   |   | 5 | 10 | 13 | X | ⊚ | ⊚ | 28 |
|   |   | 9 | 14 | 17 | X | ⊚ | ⊚ | 30 |
| 3 | 9 | 2 | 11 | 14 | X | ⊚ | X | 28 |
|   |   | 3 | 12 | 15 | X | ⊚ | ○ | 29 |
|   |   | 5 | 14 | 17 | X | ⊚ | ⊚ | 30 |
|   |   | 9 | 18 | 21 | X | ⊚ | ⊚ | 31 |

Referring to Table 1, it may be appreciated that in a case in which the thickness of the conductive layer of the external electrode was 3 μm, in all of the samples, ESL was low, but the high temperature load defect occurred in all of the samples regardless of the thicknesses of the nickel plating layer and the tin plating layer.

TABLE 2

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 5 | 1 | 2 | 3 | 8 | ○ | X | X | 25 |
|   |   | 3 | 4 | 9 | ○ | X | ○ | 27 |
|   |   | 5 | 6 | 11 | ○ | X | ⊚ | 28 |
|   |   | 9 | 10 | 15 | ○ | X | ⊚ | 29 |
| 5 | 2 | 2 | 4 | 9 | ○ | ○ | X | 27 |
|   |   | 3 | 5 | 10 | ○ | ○ | ○ | 27 |
|   |   | 5 | 7 | 12 | ○ | ○ | ⊚ | 28 |
|   |   | 9 | 11 | 16 | ○ | ○ | ⊚ | 30 |
| 5 | 3 | 2 | 5 | 10 | ○ | ⊚ | X | 27 |
|   |   | 3 | 6 | 11 | ○ | ⊚ | ○ | 29 |
|   |   | 5 | 8 | 13 | ○ | ⊚ | ⊚ | 28 |
|   |   | 9 | 12 | 17 | ○ | ⊚ | ⊚ | 31 |
| 5 | 5 | 2 | 7 | 12 | ○ | ⊚ | X | 29 |
|   |   | 3 | 8 | 13 | ○ | ⊚ | ○ | 29 |
|   |   | 5 | 10 | 15 | ○ | ⊚ | ⊚ | 30 |
|   |   | 9 | 14 | 19 | ○ | ⊚ | ⊚ | 32 |

TABLE 2-continued

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 5 | 9 | 2 | 11 | 16 | ○ | ◎ | X | 30 |
|   |   | 3 | 12 | 17 | ○ | ◎ | ○ | 31 |
|   |   | 5 | 14 | 19 | ○ | ◎ | ◎ | 32 |
|   |   | 9 | 18 | 23 | ○ | ◎ | ◎ | 33 |

Referring to Table 2, it may be appreciated that in a case in which the thickness of the conductive layer of the external electrode was 5 μm, in all of the samples, ESL was low, and the high temperature load defect rate was also low.

However, it may be appreciated that in all of the samples in which the thickness of the nickel plating layer was 1 μm, the reliability defect was shown, and even in a case in which the thickness of the nickel plating layer was 2 μm or more, when the thickness of the tin plating layer was 2 μm, the soldering defect was shown.

TABLE 3

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 7 | 1 | 2 | 3 | 10 | ◎ | X | X | 26 |
|   |   | 3 | 4 | 11 | ◎ | X | ○ | 29 |
|   |   | 5 | 6 | 13 | ◎ | X | ◎ | 29 |
|   |   | 9 | 10 | 17 | ◎ | X | ◎ | 31 |
| 7 | 2 | 2 | 4 | 11 | ◎ | ○ | X | 29 |
|   |   | 3 | 5 | 12 | ◎ | ○ | ○ | 29 |
|   |   | 5 | 7 | 14 | ◎ | ○ | ◎ | 30 |
|   |   | 9 | 11 | 18 | ◎ | ○ | ◎ | 32 |
| 7 | 3 | 2 | 5 | 12 | ◎ | ◎ | X | 28 |
|   |   | 3 | 6 | 13 | ◎ | ◎ | ○ | 31 |
|   |   | 5 | 8 | 15 | ◎ | ◎ | ◎ | 30 |
|   |   | 9 | 12 | 19 | ◎ | ◎ | ◎ | 33 |
| 7 | 5 | 2 | 7 | 14 | ◎ | ◎ | X | 31 |
|   |   | 3 | 8 | 15 | ◎ | ◎ | ○ | 30 |
|   |   | 5 | 10 | 17 | ◎ | ◎ | ◎ | 32 |
|   |   | 9 | 14 | 21 | ◎ | ◎ | ◎ | 34 |
| 7 | 9 | 2 | 11 | 18 | ◎ | ◎ | X | 32 |
|   |   | 3 | 12 | 19 | ◎ | ◎ | ○ | 32 |
|   |   | 5 | 14 | 21 | ◎ | ◎ | ◎ | 33 |
|   |   | 9 | 18 | 25 | ◎ | ◎ | ◎ | 35 |

Referring to Table 3, it may be appreciated that in a case in which the thickness of the conductive layer of the external electrode was 7 μm, in all of the samples, ESL was low, and the high temperature load defect rate was also low.

However, it may be appreciated that in all of the samples in which the thickness of the nickel plating layer was 1 μm, the reliability defect was shown, and even in a case in which the thickness of the nickel plating layer was 2 μm or more, when the thickness of the tin plating layer was 2 μm, the soldering defect was shown.

TABLE 4

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 12 | 1 | 2 | 3 | 15 | ◎ | X | X | 30 |
|   |   | 3 | 4 | 16 | ◎ | X | ○ | 34 |

TABLE 4-continued

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
|  |  | 5 | 6 | 18 | ◎ | X | ◎ | 34 |
|  |  | 9 | 10 | 22 | ◎ | X | ◎ | 35 |
| 12 | 2 | 2 | 4 | 16 | ◎ | ○ | X | 34 |
|  |  | 3 | 5 | 17 | ◎ | ○ | ○ | 34 |
|  |  | 5 | 7 | 19 | ◎ | ○ | ◎ | 35 |
|  |  | 9 | 11 | 23 | ◎ | ○ | ◎ | 37 |
| 12 | 3 | 2 | 5 | 17 | ◎ | ◎ | X | 33 |
|  |  | 3 | 6 | 18 | ◎ | ◎ | ○ | 36 |
|  |  | 5 | 8 | 20 | ◎ | ◎ | ◎ | 34 |
|  |  | 9 | 12 | 24 | ◎ | ◎ | ◎ | 38 |
| 12 | 5 | 2 | 7 | 19 | ◎ | ◎ | X | 35 |
|  |  | 3 | 8 | 20 | ◎ | ◎ | ○ | 35 |
|  |  | 5 | 10 | 22 | ◎ | ◎ | ◎ | 37 |
|  |  | 9 | 14 | 26 | ◎ | ◎ | ◎ | 38 |
| 12 | 9 | 2 | 11 | 23 | ◎ | ◎ | X | 37 |
|  |  | 3 | 12 | 24 | ◎ | ◎ | ○ | 37 |
|  |  | 5 | 14 | 26 | ◎ | ◎ | ◎ | 38 |
|  |  | 9 | 18 | 30 | ◎ | ◎ | ◎ | 40 |

Referring to Table 4, it may be appreciated that in a case in which the thickness of the conductive layer of the external electrode was 12 μm, in all of the samples, ESL was low, and the high temperature load defect rate was also low.

Particularly, in a case in which the thickness of the nickel plating layer was 3 μm or more, the reliability was also excellent.

However, it may be appreciated that in all of the samples in which the thickness of the nickel plating layer was 1 μm, the reliability defect was shown, and even in a case in which the thickness of the nickel plating layer was 2 μm or more, when the thickness of the tin plating layer was 2 μm, the soldering defect was shown.

Referring to Table 5, it may be appreciated that in a case in which the thickness of the conductive layer of the external electrode was 25 μm, ESL was approximately 40 to 50, and the high temperature load defect rate was significantly low.

Particularly, in a case in which the thickness of the nickel plating layer was 3 μm or more, the reliability was also excellent.

However, it may be appreciated that in all of the samples in which the thickness of the nickel plating layer was 1 μm, the reliability defect was shown, and even in a case in which the thickness of the nickel plating layer was 2 μm or more, when the thickness of the tin plating layer was 2 μm, the soldering defect was shown.

TABLE 5

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 25 | 1 | 2 | 3 | 28 | ◎ | X | X | 43 |
|  |  | 3 | 4 | 29 | ◎ | X | ○ | 46 |
|  |  | 5 | 6 | 31 | ◎ | X | ◎ | 45 |
|  |  | 9 | 10 | 35 | ◎ | X | ◎ | 48 |
| 25 | 2 | 2 | 4 | 29 | ◎ | ○ | X | 45 |
|  |  | 3 | 5 | 30 | ◎ | ○ | ○ | 46 |
|  |  | 5 | 7 | 32 | ◎ | ○ | ◎ | 47 |
|  |  | 9 | 11 | 36 | ◎ | ○ | ◎ | 48 |
| 25 | 3 | 2 | 5 | 30 | ◎ | ◎ | X | 44 |
|  |  | 3 | 6 | 31 | ◎ | ◎ | ○ | 47 |
|  |  | 5 | 8 | 33 | ◎ | ◎ | ◎ | 46 |
|  |  | 9 | 12 | 37 | ◎ | ◎ | ◎ | 49 |
| 25 | 5 | 2 | 7 | 32 | ◎ | ◎ | X | 47 |
|  |  | 3 | 8 | 33 | ◎ | ◎ | ○ | 48 |
|  |  | 5 | 10 | 35 | ◎ | ◎ | ◎ | 48 |
|  |  | 9 | 14 | 39 | ◎ | ◎ | ◎ | 50 |
| 25 | 9 | 2 | 11 | 36 | ◎ | ◎ | X | 49 |
|  |  | 3 | 12 | 37 | ◎ | ◎ | ○ | 50 |
|  |  | 5 | 14 | 39 | ◎ | ◎ | ◎ | 50 |
|  |  | 9 | 18 | 43 | ◎ | ◎ | ◎ | 52 |

Further, it may be appreciated that in a case in which the thickness of the nickel plating layer was 9 μm and the thickness of the tin plating layer was 9 μm, the overall thickness of the external electrodes was greater than 40 μm, and ESL was 52 pH, exceeding 50 pH.

TABLE 6

| Thickness of Conductive Layer (CT, um) | Thickness of Ni Plating Layer (NT, um) | Thickness of Sn Plating Layer (ST, um) | PT (NT + ST) | TS (CT + NT + ST) | High Temperature Load (105° C. 2Vr) | Reliability | Soldering Defect | ESL (pH) |
|---|---|---|---|---|---|---|---|---|
| 34 | 1 | 2 | 3 | 37 | ◎ | X | X | 48 |
|  |  | 3 | 4 | 38 | ◎ | X | ○ | 49 |
|  |  | 5 | 6 | 40 | ◎ | X | ◎ | 50 |
|  |  | 9 | 10 | 44 | ◎ | X | ◎ | 56 |
| 34 | 2 | 2 | 4 | 38 | ◎ | ○ | X | 49 |
|  |  | 3 | 5 | 39 | ◎ | ○ | ○ | 50 |
|  |  | 5 | 7 | 41 | ◎ | ○ | ◎ | 51 |
|  |  | 9 | 11 | 45 | ◎ | ○ | ◎ | 57 |
| 34 | 3 | 2 | 5 | 39 | ◎ | ◎ | X | 49 |
|  |  | 3 | 6 | 40 | ◎ | ◎ | ○ | 50 |
|  |  | 5 | 8 | 42 | ◎ | ◎ | ◎ | 52 |
|  |  | 9 | 12 | 46 | ◎ | ◎ | ○ | 57 |
| 34 | 5 | 2 | 7 | 41 | ◎ | ◎ | X | 51 |
|  |  | 3 | 8 | 42 | ◎ | ◎ | ○ | 52 |
|  |  | 5 | 10 | 44 | ◎ | ◎ | ◎ | 53 |
|  |  | 9 | 14 | 48 | ◎ | ◎ | ◎ | 59 |
| 34 | 9 | 2 | 11 | 45 | ◎ | ◎ | X | 57 |
|  |  | 3 | 12 | 46 | ◎ | ◎ | ○ | 58 |
|  |  | 5 | 14 | 48 | ◎ | ◎ | ◎ | 59 |
|  |  | 9 | 18 | 52 | ◎ | ◎ | ◎ | 61 |

Referring to Table 6, it may be appreciated that in a case in which the thickness of the conductive layer of the external electrode was 34 μm, ESL was from 45 pH or more to more than 60 pH, and the high temperature load defect rate was significantly low.

Particularly, in a case in which the thickness of the nickel plating layer was 3 μm or more, the reliability was also excellent.

However, it may be appreciated that in all of the samples in which the thickness of the nickel plating layer was 1 μm, the reliability defect was shown, and even in a case in which the thickness of the nickel plating layer was 2 μm or more, when the thickness of the tin plating layer was 2 μm, the soldering defect was shown.

Meanwhile, it may be appreciated that in all of the samples in which the overall thickness of the external electrodes was over 40 μm, ESL was over 50 pH.

Referring to Tables 1 through 6, it may be appreciated that in the case of decreasing the overall thickness of the external electrodes, a length of the current path was decreased, such that ESL was decreased, but reliability was deteriorated due to the infiltration of a plating solution.

Further, it may be appreciated that in the case of decreasing the thickness of the nickel plating layer, the tin plating layer and the conductive layer were in contact with each other, such that a melting temperature of the conductive layer was decreased at the time of soldering, thereby causing a reliability defect.

In addition, it may be appreciated that in the case of decreasing the thickness of the tin plating layer, the soldering defect may occur.

Therefore, it may be appreciated that the thickness CT of the first to third conductive layers 133a, 134a, and 136a may be 5 to 25 μm, the thickness NT of the first to third nickel plating layers 133b, 134b, and 136b may be 2 μm or more, the thickness ST of the first to third tin plating layers 133c, 134c, and 136c may be 3 μm or more, and the sum PT of the thicknesses of the nickel plating layer and the tin plating layer may be 15 μm or less.

The following Table 7 shows results obtained by testing whether or not high temperature load defect occurred, whether or not reliable adhesion was performed, whether or not a soldering defect occurred, and whether or not a mounting defect occurred, and measuring equivalent serial inductance (ESL), depending on the thickness AT of the active layer of the multilayer ceramic capacitor and the gap LG between the first or second lead part and the third lead part.

TABLE 7

| Thickness of Active Layer [AT], (um) | Gap Between Lead parts of Internal Electrode [LG] (um) | LG* log [1/AT] | High Temperature Load (105° C. 2Vr) | Reliability | Soldering Defect | Mounting Defect | ESL (pH) |
|---|---|---|---|---|---|---|---|
| 500 | 100 | 0.00033 | ◎ | ◎ | ◎ | X | 40 |
|  | 150 | 0.00050 | ◎ | ◎ | ◎ | ◎ | 43 |

TABLE 7-continued

| Thickness of Active Layer [AT], (um) | Gap Between Lead parts of Internal Electrode [LG] (um) | LG*log [1/AT] | High Temperature Load (105° C. 2Vr) | Reliability | Soldering Defect | Mounting Defect | ESL (pH) |
|---|---|---|---|---|---|---|---|
| | 200 | 0.00066 | ⊚ | ⊚ | ⊚ | ⊚ | 46 |
| | 300 | 0.00099 | ⊚ | ⊚ | ⊚ | ⊚ | 50 |
| | 500 | 0.00165 | ⊚ | ⊚ | ⊚ | ⊚ | 56 |
| 800 | 100 | 0.00031 | ⊚ | ⊚ | ⊚ | X | 38 |
| | 150 | 0.00046 | ⊚ | ⊚ | ⊚ | ⊚ | 41 |
| | 200 | 0.00062 | ⊚ | ⊚ | ⊚ | ⊚ | 43 |
| | 300 | 0.00093 | ⊚ | ⊚ | ⊚ | ⊚ | 48 |
| | 500 | 0.00155 | ⊚ | ⊚ | ⊚ | ⊚ | 52 |
| 1000 | 100 | 0.00030 | ⊚ | ⊚ | ⊚ | X | 35 |
| | 150 | 0.00045 | ⊚ | ⊚ | ⊚ | ⊚ | 38 |
| | 200 | 0.00060 | ⊚ | ⊚ | ⊚ | ⊚ | 41 |
| | 300 | 0.00090 | ⊚ | ⊚ | ⊚ | ⊚ | 44 |
| | 500 | 0.00150 | ⊚ | ⊚ | ⊚ | ⊚ | 50 |
| 1200 | 100 | 0.00029 | ⊚ | ⊚ | ⊚ | X | 33 |
| | 150 | 0.00044 | ⊚ | ⊚ | ⊚ | ⊚ | 35 |
| | 200 | 0.00058 | ⊚ | ⊚ | ⊚ | ⊚ | 38 |
| | 300 | 0.00088 | ⊚ | ⊚ | ⊚ | ⊚ | 46 |
| | 500 | 0.00146 | ⊚ | ⊚ | ⊚ | ⊚ | 48 |

Referring to Table 7, when the thickness of the active layer was defined as AT, and the gap between the first or second lead part and the third lead part was defined as LG, in a case in which LG*log [1/AT] was greater than 0.00150, ESL exceeded 50 pH.

In addition, it may be appreciated that in the case in which LG*log [1/AT] was less than 0.00044, the mounting defect occurred.

As described above, as the gap LG was decreased, the length of a current path was decreased, thereby decreasing ESL, but a gap between the external electrodes was decreased, such that mounting stability may be deteriorated.

In the exemplary embodiment, when the thickness of the active layer is defined as AT, and the gap between the first or second lead part and the third lead part is defined as LG, it may be appreciated that both of the mounting stability and ESL of 50 pH or less may be achieved by satisfying the following Equation: $0.00044 \leq LG*\log [1/AT]$.

Modified Example

Figure 5:
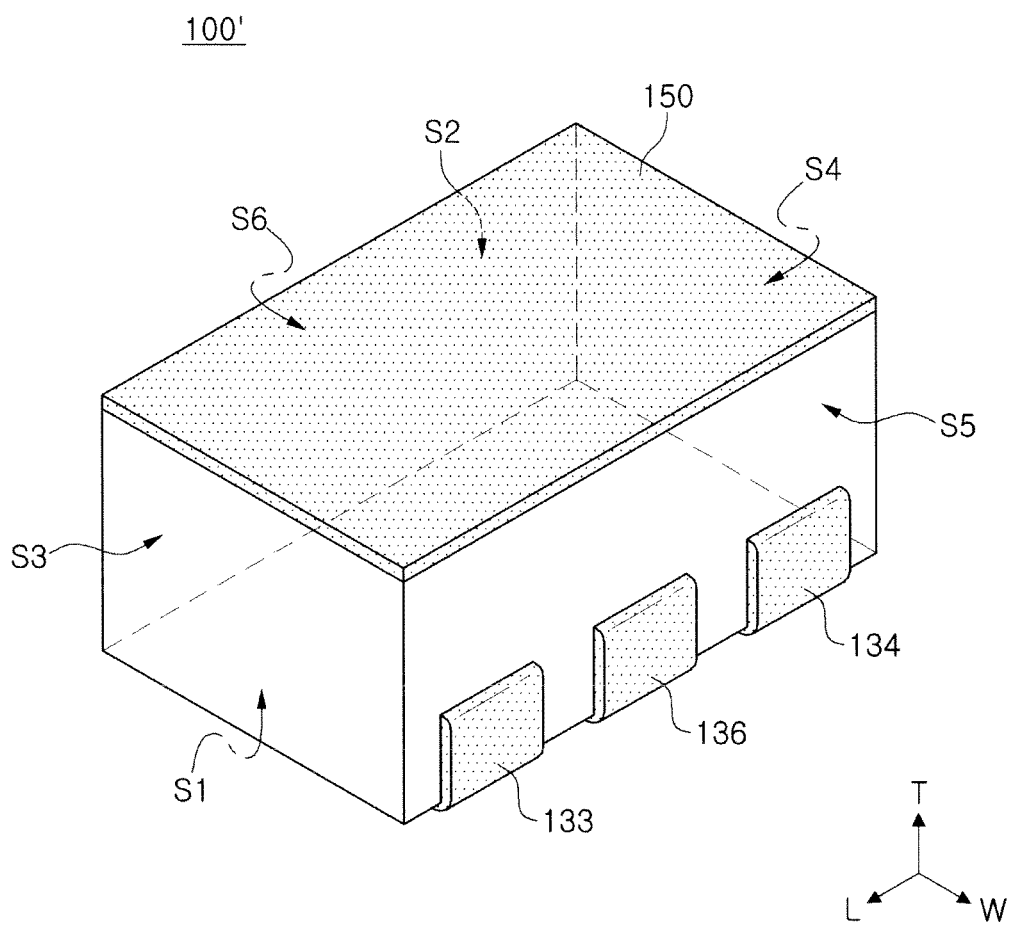
FIG. 5 is a perspective view schematically showing a multilayer ceramic capacitor according to another exemplary embodiment in the present disclosure.
Figure 6:
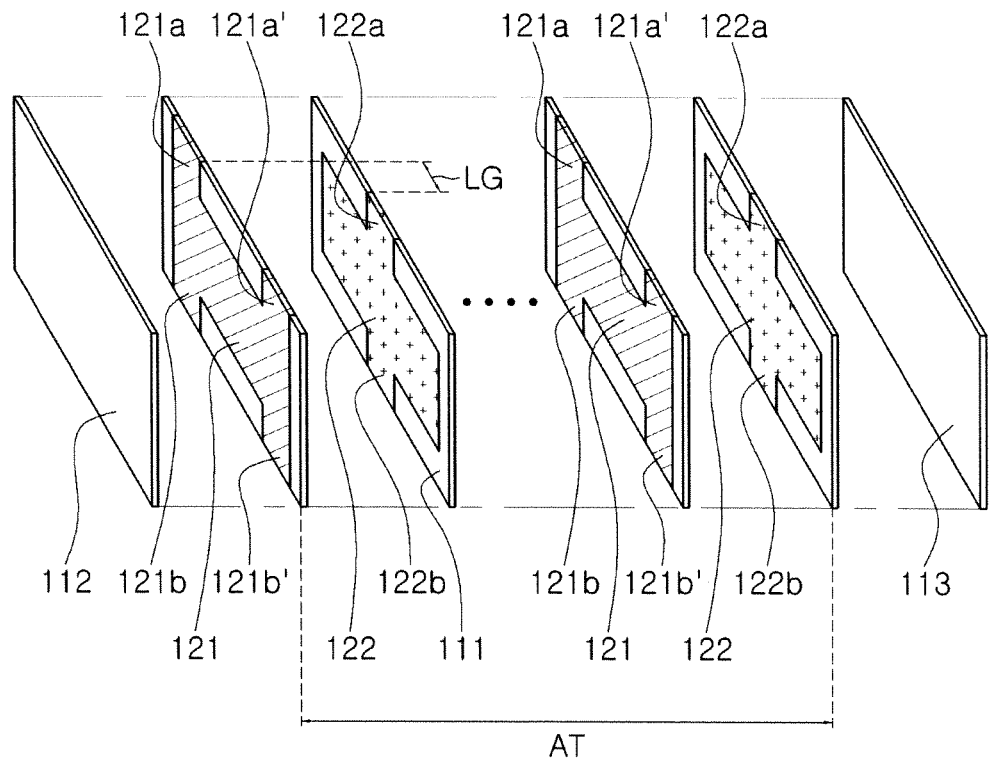
FIG. 6 is an exploded perspective view showing the multilayer ceramic capacitor of FIG. 5 in a state in which an external electrode thereof is omitted.

FIG. 5 is a perspective view schematically showing a multilayer ceramic capacitor according to another exemplary embodiment in the present disclosure; FIG. 6 is an exploded perspective view showing the multilayer ceramic capacitor of FIG. 5 in a state in which an external electrode thereof is omitted; and FIG. 7 is a cross-sectional view showing the multilayer ceramic capacitor of FIG. 5.

Here, since a structure of a ceramic body 110 is the same as that in the above-mentioned exemplary embodiment, a detailed description thereof will be omitted in order to avoid an overlapped description, and first and second internal electrodes 121 and 122 having different structures from those in the above-mentioned exemplary embodiment and an insulating layer 150 will be described in detail.

Figure 7:
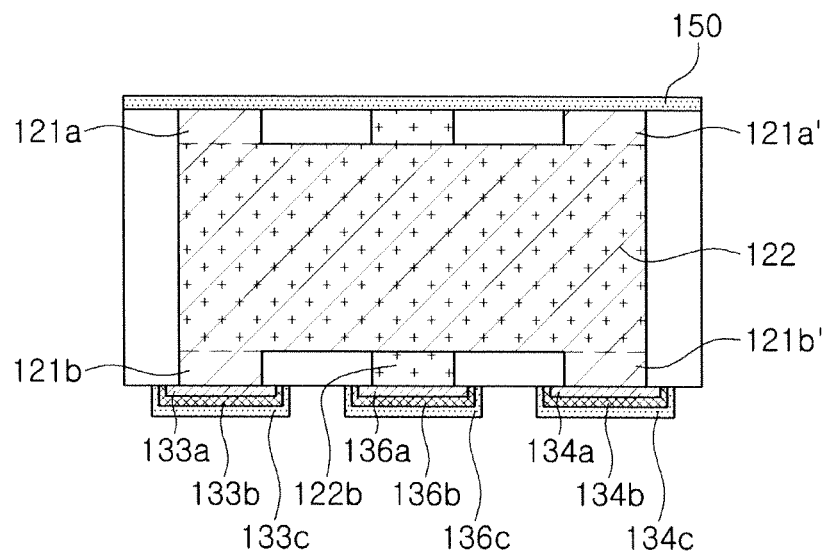
FIG. 7 is a cross-sectional view showing the multilayer ceramic capacitor of FIG. 5.

Referring to FIGS. 5 through 7, the insulating layer 150 may be disposed on a second main surface S2 opposing a mounting surface of the ceramic body 110.

The first internal electrode 121 may have fourth and fifth lead parts 121a and 121a' exposed to the second main surface S2 of the ceramic body 110 to come into contact with the insulating layer 150 formed on the second main surface S2 of the ceramic body 110.

The second internal electrode 122 may have a sixth lead part 122a disposed between the fourth and fifth lead parts 121a and 121a' and exposed to the second main surface S2 of the ceramic body 110 to come into contact with the insulating layer 150.

Figure 8:
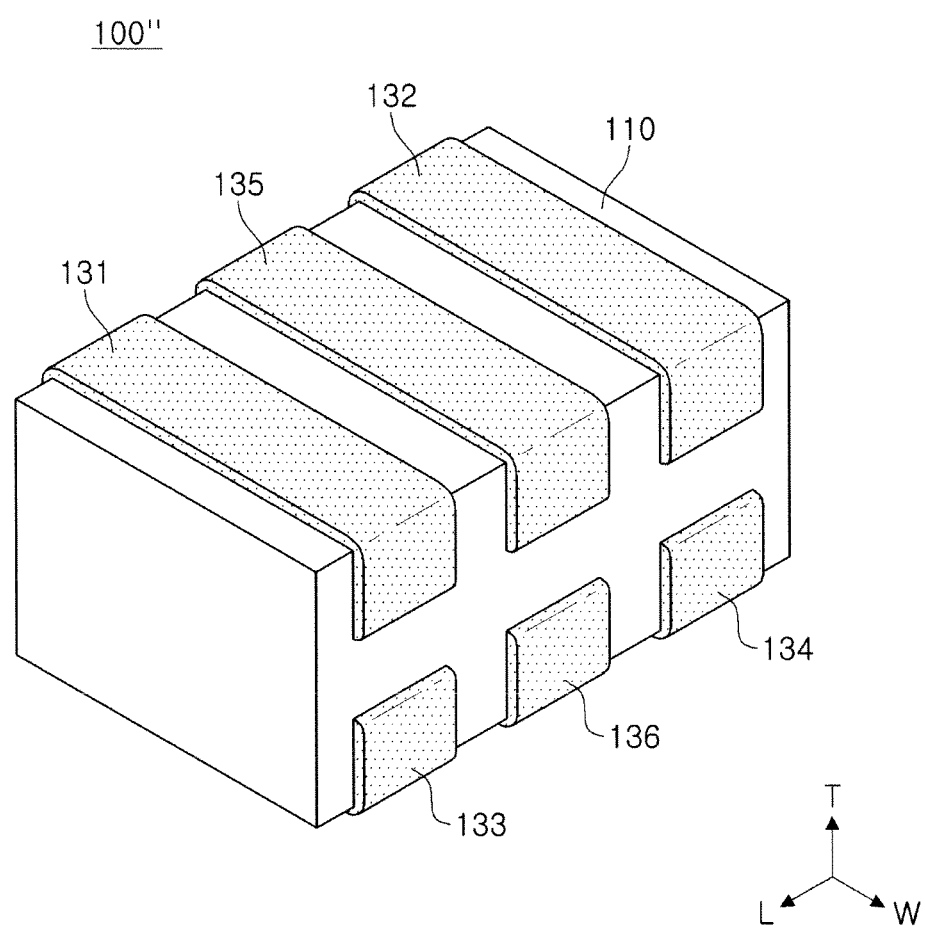
FIG. 8 is a perspective view schematically showing a multilayer ceramic capacitor according to another exemplary embodiment in the present disclosure.
Figure 9:
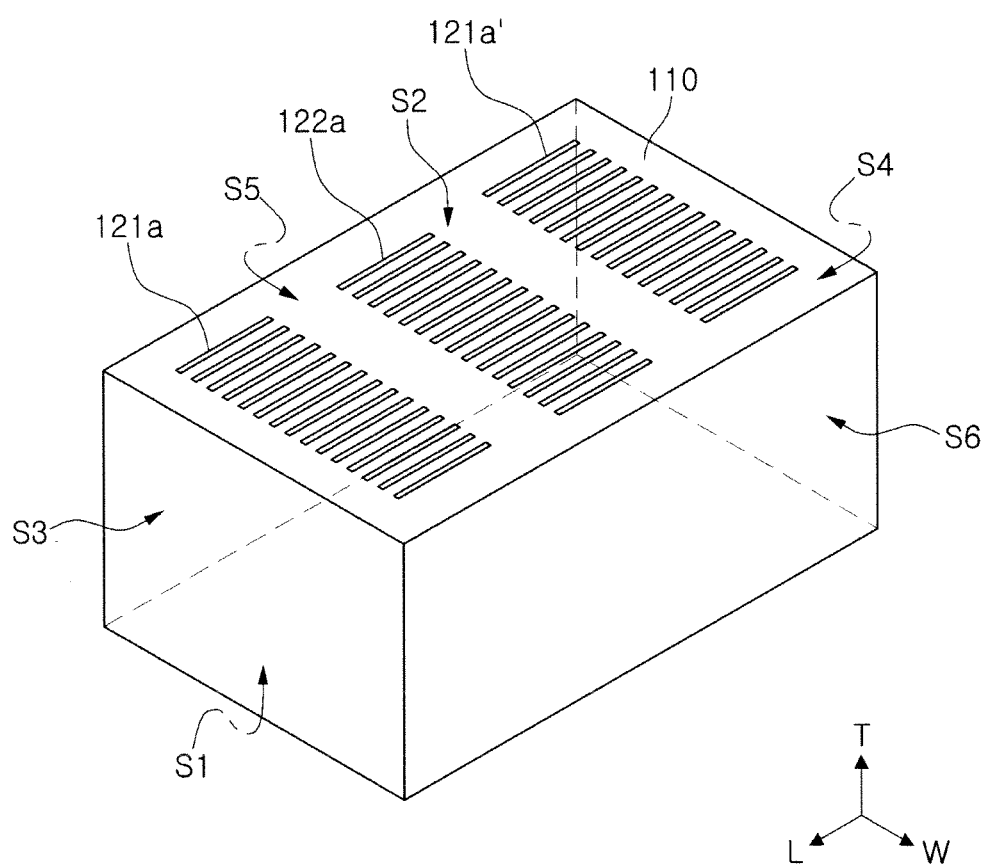
FIG. 9 is a perspective view showing a ceramic body of the multilayer ceramic capacitor of FIG. 8.
Figure 10:
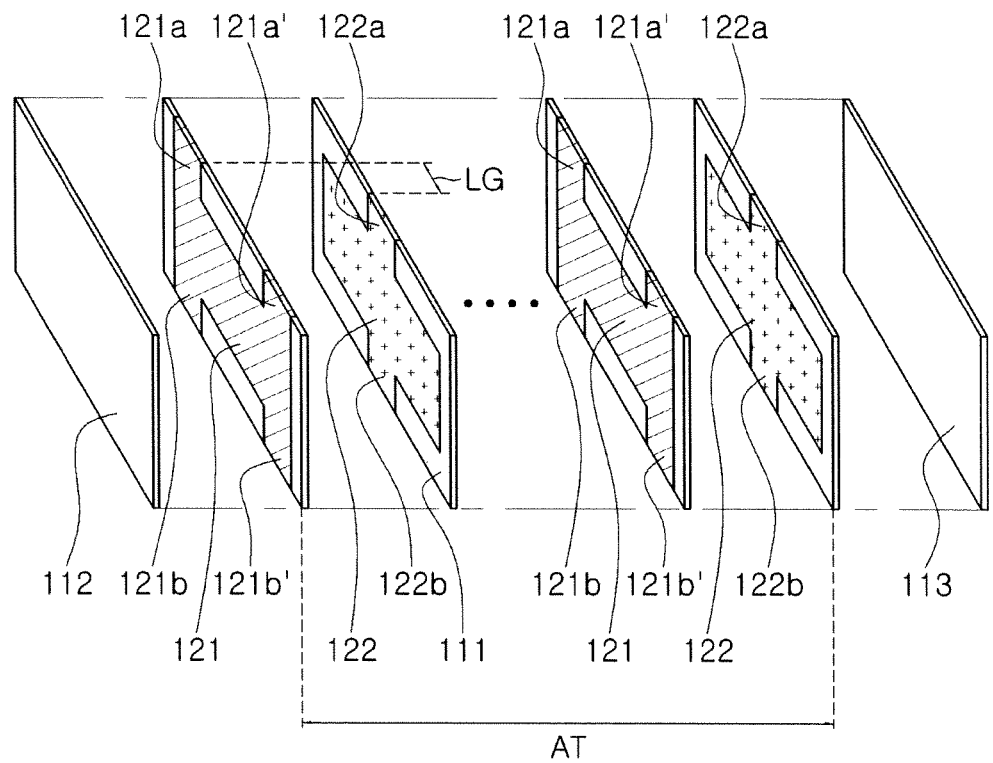
FIG. 10 is an exploded perspective view showing the multilayer ceramic capacitor of FIG. 8 in a state in which an external electrode thereof is omitted.
Figure 11:
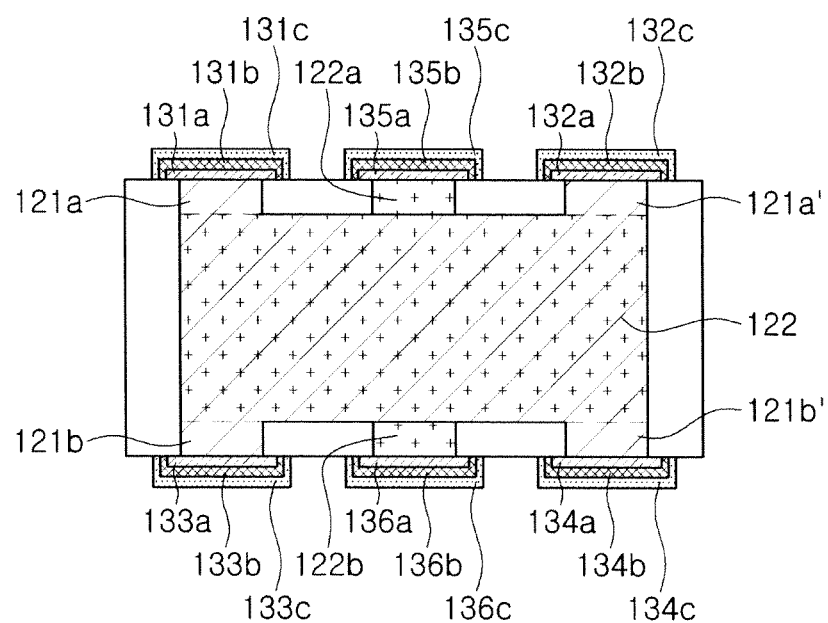
FIG. 11 is a cross-sectional view showing the multilayer ceramic capacitor of FIG. 8.

FIG. 8 is a perspective view schematically showing a multilayer ceramic capacitor according to another exemplary embodiment in the present disclosure; FIG. 9 is a perspective view showing a ceramic body of the multilayer ceramic capacitor of FIG. 8; FIG. 10 is an exploded perspective view showing the multilayer ceramic capacitor of FIG. 8 in a state in which an external electrode thereof is omitted; and FIG. 11 is a cross-sectional view showing the multilayer ceramic capacitor of FIG. 8.

Here, since a structure of a ceramic body 110 is the same as that in the above-mentioned exemplary embodiment, a detailed description thereof will be omitted in order to avoid an overlapped description, and fourth to sixth external electrodes 131, 132, and 135 and first and second internal electrodes 121 and 122 having different structures from those in the above-mentioned exemplary embodiment will be described in detail.

Referring to FIGS. 8 through 11, in a multilayer ceramic capacitor 100" according to the exemplary embodiment, the fourth to sixth external electrodes 131, 132, 135 may be disposed on the second main surface S2 of the ceramic body 110 so as to face first to third external electrodes 133, 134, and 136, respectively.

In this case, if necessary, the fourth to sixth external electrodes 131, 132, and 135 may be extended to portions of first and second side surfaces S5 and S6 of the ceramic body 110 in the width direction.

The fourth to sixth external electrodes 131, 132, and 135 as described above may have a three layer structure and may include fourth to sixth conductive layers 131a, 132a, and 135a coming into contact with the lead parts of the internal electrodes disposed in positions corresponding to the conductive layers, respectively, to thereby be connected thereto, fourth to sixth nickel (Ni) plating layers 131b, 132b, and 135b formed to cover the fourth to sixth conductive layers 131a, 132a, and 135a, and fourth to sixth tin (Sn) plating layers 131c, 132c, and 135c formed to cover the fourth to sixth nickel plating layers 131b, 132b, and 135b.

The first internal electrode 121 may have fourth and fifth lead parts 121a and 121a' exposed to the second main surface S2 of the ceramic body 110 to thereby be connected to the fourth and fifth external electrodes 131 and 132 formed on the second main surface S2 of the ceramic body 110, respectively.

The second internal electrode 122 may have a sixth lead part 122a disposed between the fourth and fifth lead parts 121a and 121a' and exposed to the second main surface S2 of the ceramic body 110 to thereby be connected to the sixth external electrode 135.

As described above, in the case in which internal and external structures of the multilayer ceramic capacitor 100" are formed to be vertically symmetric to each other, When the capacitor is mounted, it may be unnecessary to confirm a direction in which the capacitor is mounted.

Therefore, since either of the first and second main surfaces S1 and S2 of the multilayer ceramic capacitor 100" may be used as the mounting surface, at the time of mounting the multilayer ceramic capacitor 100" on a board, there is no need to consider a direction of the mounting surface.

In this case, when a thickness of an active layer of the ceramic body is defined as AT, and a gap between the fourth or fifth lead part 121a or 121a' and the sixth lead part 122a is defined as LG, a relationship LG/AT between a thickness of a capacitance formation region of a chip and a distance between the lead parts of the internal electrodes may satisfy the following Equation: $0.00044 \leq LG*\log[1/AT] \leq 0.00150$. In this case, ESL of the multilayer ceramic capacitor 100" is 50 pH or less.

In addition, it is preferable that the gap LG between the fourth or fifth lead part 121a or 121a' and the sixth lead part 122a is greater than 100 μm.

In this case, when the gap LG between the fourth or fifth lead part 121a or 121a' and the sixth lead part 122a is 100 μm or less, a mounting defect may occur.

Further, a thickness of the fourth to sixth conductive layers 131a, 132a, and 135a may be defined as CT, a thickness of the fourth to sixth nickel plating layers 131b, 132b, and 135b may be defined as NT, and a thickness of the fourth to sixth tin plating layers 131c, 132c, and 135c may be defined as ST, and a sum of the thicknesses of the nickel plating layer and tin plating layer may be defined as PT.

Here, the thickness CT of the fourth to sixth conductive layers 131a, 132a, and 135a may be 5 to 25 μm.

Further, the thickness NT of the fourth to sixth nickel plating layers 131b, 132b, and 135b may be 2 μm or more.

In addition, the thickness ST of the fourth to sixth tin plating layers 131c, 132c, and 135c may be 3 μm or more.

Further, the sum PT of the thicknesses of the nickel plating layers and the tin plating layers may be 15 μm or less.

Meanwhile, results obtained by testing whether or not high temperature load defect occurred, whether or not reliable adhesion was performed, and whether or not a soldering defect occurred, and measuring equivalent serial inductance (ESL), depending on thicknesses of the conductive layer and the plating layer of the first to third external electrodes, as shown in Tables 1 to 6, may be equally applied to the fourth to sixth external electrodes.

Board Having Multilayer Ceramic Capacitor

Figure 12:
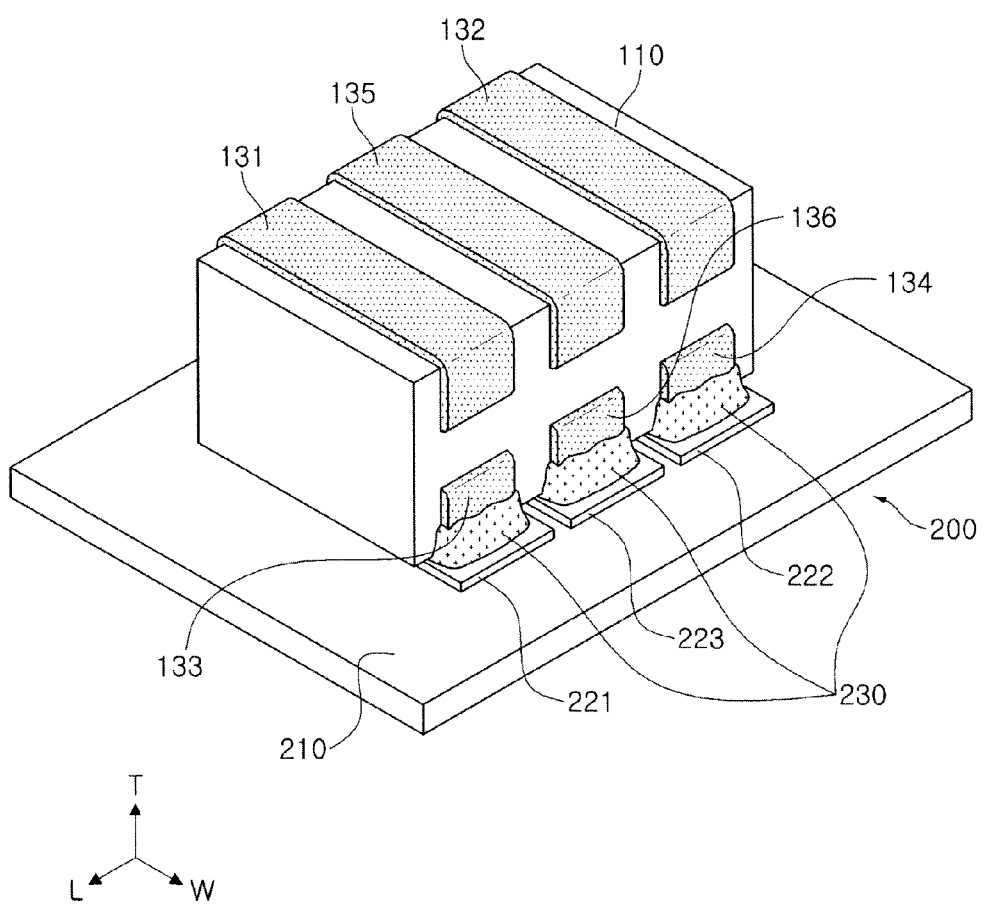
FIG. 12 is a perspective view showing a form in which the multilayer ceramic capacitor of FIG. 8 is mounted on a board.
Figure 13:
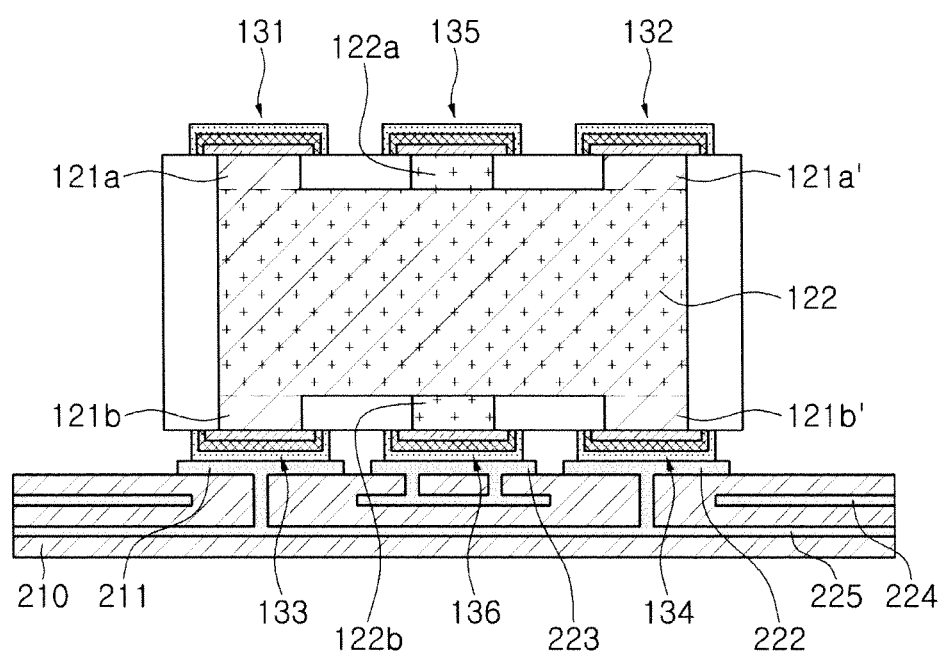
FIG. 13 is a cross-sectional view showing a form in which the multilayer ceramic capacitor of FIG. 8 is mounted on a board.

FIG. 12 is a perspective view showing a form in which the multilayer ceramic capacitor of FIG. 8 is mounted on a board, and FIG. 13 is a cross-sectional view showing a form in which the multilayer ceramic capacitor of FIG. 8 is mounted on a board.

Referring to FIGS. 12 and 13, a board 200 having a multilayer ceramic capacitor according to the exemplary embodiment may include a circuit board 210 on which the multilayer ceramic capacitor is mounted and first to third electrode pads 221 to 223 formed on the circuit board 210 to be spaced apart from one another.

In this case, the multilayer ceramic capacitor may be electrically connected to the circuit board 210 by soldering portions 230 in a state in which first to third external electrodes 133, 134, and 136 are positioned on the first to third electrode pads 221 to 223 to come into contact therewith.

In FIG. 13, a ground terminal 224 and a power terminal 225 are shown.

Meanwhile, although the case in which the multilayer ceramic capacitor of FIG. 8 is mounted is described in the exemplary embodiment, the present disclosure is not limited thereto. For example, the multilayer ceramic capacitors shown in FIGS. 1 and 5 may be mounted on a board in a similar manner to the above case, such that boards having a multilayer ceramic capacitor may be configured.

As set forth above, according to exemplary embodiments in the present disclosure, significantly low ESL characteristics of the multilayer ceramic capacitor may be implemented by adjusting the thickness of the active layer and the gap between the first or second lead part of the first internal electrodes and the third lead part of the second internal electrode.

While exemplary embodiments have been shown and described above, it will be apparent to those skilled in the art that modifications and variations could be made without departing from the spirit and scope of the invention as defined by the appended claims.

What is claimed is:

1. A multilayer ceramic capacitor comprising:
   a ceramic body including a plurality of dielectric layers stacked therein in a width direction;
   an active layer including a plurality of first and second internal electrodes alternately disposed with the respective dielectric layers interposed therebetween;
   first and second lead parts formed in the first internal electrode to be extended and exposed to a mounting surface of the ceramic body, and disposed to be spaced apart from each other in a length direction of the ceramic body;
   a third lead part formed in the second internal electrode to be extended and exposed to the mounting surface of the ceramic body, and disposed between the first and second lead parts;
   first and second external electrodes disposed on the mounting surface of the ceramic body to be spaced apart from each other in the length direction of the ceramic body, and connected to the first and second lead parts, respectively; and
   a third external electrode disposed between the first and second external electrodes, extended from the mounting surface of the ceramic body to portions of both side surfaces of the ceramic body in the width direction, and connected to the third lead part,
   wherein when a thickness of the active layer is defined as AT, and a gap between the first or second lead part and the third lead part is defined as LG, the following Equation is satisfied: $0.00044 \leq LG*\log[1/AT] \leq 0.00150$.

2. The multilayer ceramic capacitor of claim 1, wherein the first and second internal electrodes are spaced apart from both end surfaces of the ceramic body in the length direction.

3. The multilayer ceramic capacitor of claim 1, wherein the gap LG between the first or second lead part and the third lead part is greater than 100 µm.

4. The multilayer ceramic capacitor of claim 1, further comprising a cover layer formed on the both side surfaces of the active layer in the width direction.

5. The multilayer ceramic capacitor of claim 1, wherein the first to third external electrodes have a thickness of 10 to 40 µm.

6. The multilayer ceramic capacitor of claim 1, wherein the first to third external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the conductive layers having a thickness of 5 to 25 µm.

7. The multilayer ceramic capacitor of claim 1, wherein the first to third external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the nickel plating layers having a thickness of 2 µm or more.

8. The multilayer ceramic capacitor of claim 1, wherein the first to third external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the tinplating layers having a thickness of 3 µm or more.

9. The multilayer ceramic capacitor of claim 1, wherein the first to third external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, a sum of thicknesses of the nickel plating layers and the tin plating layers being 15 µm or less.

10. The multilayer ceramic capacitor of claim 1, wherein the first to third external electrodes are extended from the mounting surface of the ceramic body to portions of the both side surfaces of the ceramic body in the width direction.

11. The multilayer ceramic capacitor of claim 1, further comprising:
fourth and fifth lead parts formed in the first internal electrode to be extended and exposed to a surface opposing the mounting surface of the ceramic body, and disposed to be spaced apart from each other in the length direction of the ceramic body;
a sixth lead part formed in the second internal electrode to be extended and exposed to the surface opposing the mounting surface of the ceramic body, and disposed between the fourth and fifth lead parts; and
an insulating layer disposed on the surface opposing the mounting surface of the ceramic body.

12. The multilayer ceramic capacitor of claim 1, further comprising:
fourth and fifth lead parts formed in the first internal electrode to be extended and exposed to a surface opposing the mounting surface of the ceramic body, and disposed to be spaced apart from each other in the length direction of the ceramic body;
a sixth lead part formed in the second internal electrode to be extended and exposed to the surface opposing the mounting surface of the ceramic body, and disposed between the fourth and fifth lead parts;
fourth and fifth external electrodes disposed on the surface opposing the mounting surface of the ceramic body to be spaced apart from each other in the length direction of the ceramic body, and connected to the fourth and fifth lead parts, respectively; and
a sixth external electrode disposed between the fourth and fifth external electrodes, extended from the surface opposing the mounting surface of the ceramic body to portions of the both side surfaces of the ceramic body in the width direction, and connected to the sixth lead part.

13. The multilayer ceramic capacitor of claim 12, wherein a gap LG between the fourth or fifth lead part and the sixth lead part is greater than 100 µm.

14. The multilayer ceramic capacitor of claim 12, wherein the fourth to sixth external electrodes have a thickness of 10 to 40 µm.

15. The multilayer ceramic capacitor of claim 12, wherein the fourth to sixth external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the conductive layers having a thickness of 5 to 25 µm.

16. The multilayer ceramic capacitor of claim 12, wherein the fourth to sixth external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the nickel plating layers having a thickness of 2 µm or more.

17. The multilayer ceramic capacitor of claim 12, wherein the fourth to sixth external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, the tinplating layers having a thickness of 3 µm or more.

18. The multilayer ceramic capacitor of claim 12, wherein the fourth to sixth external electrodes include conductive layers coming into contact with the lead parts disposed in positions corresponding to the conductive layers, respectively, to thereby be connected to the lead parts, nickel (Ni) plating layers formed to cover the conductive layers, and tin (Sn) plating layers formed to cover the nickel plating layers, a sum of thicknesses of the nickel plating layers and the tin plating layers being 15 µm or less.

19. The multilayer ceramic capacitor of claim 12, wherein the fourth to sixth external electrodes are extended from the surface opposing the mounting surface of the ceramic body to portions of the both side surfaces of the ceramic body in the width direction.

20. A board having a multilayer ceramic capacitor comprising:
- a circuit board having first to third electrode pads formed thereon; and
- the multilayer ceramic capacitor of claim 1 having the first to third external electrodes disposed on the first to third electrode pads, respectively.

21. A board having a multilayer ceramic capacitor comprising:
- a circuit board having first to third electrode pads formed thereon; and
- the multilayer ceramic capacitor of claim 11 having the first to third external electrodes disposed on the first to third electrode pads, respectively.

22. A board having a multilayer ceramic capacitor comprising:
- a circuit board having first to third electrode pads formed thereon; and
- the multilayer ceramic capacitor of claim 12 having the first to third external electrodes disposed on the first to third electrode pads, respectively.

\* \* \* \* \*

UNITED STATES PATENT AND TRADEMARK OFFICE
CERTIFICATE OF CORRECTION

| | | |
|---|---|---|
| PATENT NO. | : 9,460,855 B2 | Page 1 of 1 |
| APPLICATION NO. | : 14/504000 | |
| DATED | : October 4, 2016 | |
| INVENTOR(S) | : Lee et al. | |

It is certified that error appears in the above-identified patent and that said Letters Patent is hereby corrected as shown below:

On the Title Page

Under the item (57) Abstract:

Line 2, please change "amounting" to read --a mounting--.

Signed and Sealed this
Fourteenth Day of March, 2017

Michelle K. Lee
*Director of the United States Patent and Trademark Office*